United States Patent [19]

Stanchina et al.

[11] Patent Number: 5,349,201
[45] Date of Patent: Sep. 20, 1994

[54] NPN HETEROJUNCTION BIPOLAR TRANSISTOR INCLUDING ANTIMONIDE BASE FORMED ON SEMI-INSULATING INDIUM PHOSPHIDE SUBSTRATE

[75] Inventors: William E. Stanchina, Thousand Oaks; Thomas C. Hasenberg, Agoura Hills, both of Calif.

[73] Assignee: Hughes Aircraft Company, Los Angeles, Calif.

[21] Appl. No.: 889,864

[22] Filed: May 28, 1992

[51] Int. Cl.$^5$ .................. H01L 29/161; H01L 29/205; H01L 27/12
[52] U.S. Cl. ........................ 257/18; 257/22; 257/197; 257/201
[58] Field of Search ............. 257/15, 18, 22, 197, 257/200, 201

[56] References Cited

U.S. PATENT DOCUMENTS

| | | | |
|---|---|---|---|
| 4,979,009 | 12/1990 | Kusano et al. | 257/197 |
| 5,010,382 | 4/1991 | Katoh | 257/15 |
| 5,063,426 | 11/1991 | Chandrasekhar et al. | 257/197 |
| 5,150,185 | 9/1992 | Yamada | 257/197 |

FOREIGN PATENT DOCUMENTS

| | | | |
|---|---|---|---|
| 2-288233 | 11/1990 | Japan | 257/197 |
| 3-108725 | 5/1991 | Japan | 257/197 |
| 4-221834 | 8/1992 | Japan | 257/197 |

OTHER PUBLICATIONS

"AlInAs/GaInAs HBT Technology", J. Jensen et al., IEEE Journal of Solid-State Circuits, vol. 26, No. 3, Mar. 1991, pp. 415–421.
"Band-edge alignment in heterostructures", F. Schuermeyer et al., Applied Phys. Letters, vol. 55, No. 18, Oct. 30, 1989, pp. 1877–1878.
"p-type doping of gallium antimonide grown by molecular beam epitaxy using silicon", T. Rossi et al., Applied Phys. Letters, vol. 57, No. 21, Nov. 19, 1990, pp. 2256–2258.

*Primary Examiner*—Rolf Hille
*Assistant Examiner*—Minhloan Tran
*Attorney, Agent, or Firm*—V. D. Duraiswamy; W. K. Denson-Low

[57] ABSTRACT

A heterojunction bipolar transistor (HBT) (10,30) includes an indium-gallium-arsenide (InGaAs), indium-phosphide (InP) or aluminum-indium-arsenide (AlInAs) collector layer (14) formed over an indium-phosphide (InP) substrate (12). A base layer (16,32) including gallium (Ga), arsenic (As) and antimony (Sb) is formed over the collector layer (14), and an AlInAs or InP emitter layer (18) is formed over the base layer (16,32). The base layer may be ternary gallium-arsenide-antimonide (GaAsSb) doped with beryllium (Be) (16), or a strained-layer-superlattice (SLS) structure (32) including alternating superlattice (32b,32a) layers of undoped gallium-arsenide (GaAs) and P-doped gallium-antimonide (GaSb). The GaSb superlattice layers (32a) are preferably doped with silicon (Si), which is much less diffusive than Be.

20 Claims, 2 Drawing Sheets

NPN HETEROJUNCTION BIPOLAR TRANSISTOR INCLUDING ANTIMONIDE BASE FORMED ON SEMI-INSULATING INDIUM PHOSPHIDE SUBSTRATE

BACKGROUND OF THE INVENTION

1. Field of the Invention

The present invention generally relates to the field of high-speed electronic transistor devices, and more specifically to an NPN heterojunction bipolar transistor (HBT) including an antimonide base formed on a semi-insulating indium phosphide (InP) substrate.

2. Description of the Related Art

HBTs provide substantial advantages over conventional homojunction bipolar transistors by enabling energy-gap variations in addition to electric fields as forces acting on electrons and holes. In an HBT, the emitter is designed to have a wider bandgap than the base, creating an energy barrier in the valence band at the emitter-base junction which inhibits unwanted flow of holes from the base to the emitter and substantially increases the emitter injection efficiency, current gain and operating frequency.

The wide-bandgap emitter enables very high base doping, allowing low base resistance to be obtained even with small base widths. The emitter doping can be reduced to moderate levels, allowing a reduction in base-emitter capacitance.

The advantages of HBTs have been extensively demonstrated for high-speed aluminum-gallium-arsenide/-gallium-arsenide (AlGaAs/GaAs) HBTs. Moreover, alternative material systems for fabricating HBTs, including indium phosphide/indium-gallium-arsenide (InP/InGaAs) and aluminum-indium-arsenide/indium-gallium-arsenide(AlInAs/InGaAs) offer even higher performance as described in an article entitled "AlInAs/GaInAs HBT Technology" by J. Jensen et al, in IEEE Journal of Solid-State Circuits, Vol. 26, No. 3, March 1991, pp. 415–421.

However, HBTs fabricated using the latter material systems have maximum frequencies of oscillation ($f_{max}$) which are lower than their respective high cutoff frequencies ($f_T$) due to relatively high values of the product of base resistance and collector capacitance. This limits the potential speed and output power of circuits incorporating these HBTs because, as a desired design parameter, $f_{max}$ should be approximately twice $f_T$.

Moreover, the base layer of InP/InGaAs and AlInAs/InGaAs/InGaAs HBTs is typically doped with beryllium (Be) as a P-type dopant. Be is highly diffusive, and migrates rapidly from the base layer into the emitter layer during growth and even during device operation, causing the P-N junction to be displaced from the emitter-base junction into the emitter layer. As a consequence, an energy barrier to electron flow is created and the barrier to hole flow is reduced, thus reducing the current gain.

Therefore, there is a need for an HBT device which overcomes these problems that has enhanced performance characteristics, such as high $f_{max}$ than the conventional HBTs, and is doped with Be or other P-type dopant without conventional notorious effects.

SUMMARY OF THE INVENTION

Accordingly, a heterojunction bipolar transistor (HBT) embodying the present invention having enhanced performance characteristics includes an indium-gallium-arsenide (InGaAs), indium-phosphide (InP) or aluminum-indium-arsenide (AlInAs) collector layer formed over an indium-phosphide (InP) semi-insulating substrate. A base layer including gallium (Ga), arsenic (As) and antimony (Sb) is formed over the collector layer, and an aluminum-indium-arsenide (AlInAs) or InP emitter layer is formed over the base layer.

The base layer may be ternary gallium-arsenide-antimonide (GaAsSb) doped with beryllium (Be), or a strained-layer-superlattice (SLS) structure including alternating superlattice layers of undoped GaAs and P-type gallium-antimonide (GaSb). The GaSb superlattice layers are preferably doped with silicon (Si), which is much less diffusive than Be and enables the HBT to be fabricated with negligible displacement of the P-N junction from the emitter-base junction into the emitter layer.

The use of Sb in the base layer rather than indium (In) and arsenic (As) as in conventional InP/InGaAs or AlInAs/InGaAs HBTs provides advantages including:

1. Higher valence band offset at the emitter-base junction, resulting in improved emitter injection efficiency.
2. Lower conduction band offset at the emitter-base junction, resulting in reduced power dissipation.
3. Reduced base resistance due to increased hole mobility, resulting in higher $f_{max}$.
4. A potential barrier at the base-collector junction which reduces charge storage, also resulting in higher $f_{max}$.

These and other features and advantages of the present invention will be apparent to those skilled in the art from the following detailed description, taken together with the accompanying drawings, in which like reference numerals refer to like parts.

DETAILED DESCRIPTION OF THE INVENTION

Figure 1:
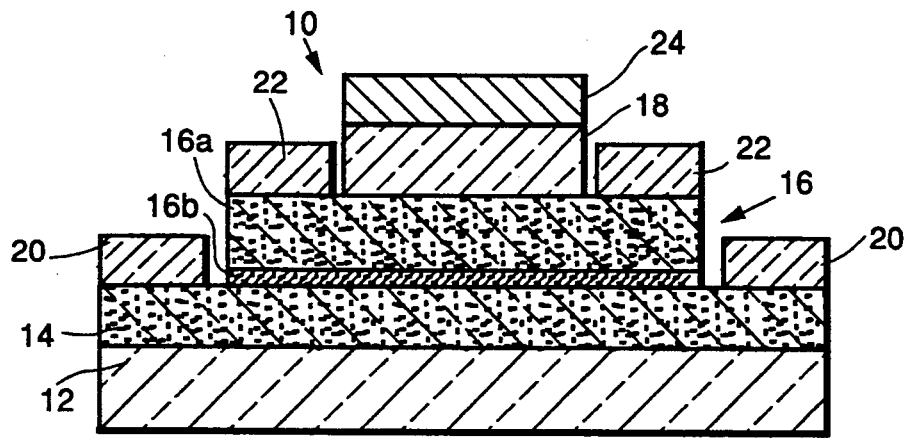
FIG. 1 is a simplified fragmentary sectional view illustrating a first embodiment of an HBT embodying the present invention.

Referring now to FIG. 1 of the drawing, an NPN heterojunction bipolar transistor (HBT) embodying the present invention is illustrated in simplified form and generally designated as 10. The HBT 10 includes a semi-insulating InP substrate 12, an indium-gallium-arsenide ($In_{0.53}Ga_{0.47}As$), indium-phosphide (InP) or aluminum-indium-arsenide ($Al_{0.48}In_{0.52}As$) collector layer 14 which is formed over the substrate 12 and doped N-type, a ternary $GaAs_ySb_{1-y}$ base layer 16 which formed over the collector layer 14 and doped P-type and an InP or $Al_{0.48}In_{0.52}As$ emitter layer 18 which is formed over the base layer 16 and doped N-type. The value of y in the $GaAs_ySb_{1-y}$ base layer 16 is preferably 0.5, but is variable between 0 and 1.

The collector, base and emitter layers 14, 16 and 18 respectively are lattice matched as closely as possible to the substrate 12. Although the collector layer 14 is illustrated as being disposed between the base layer 16 and substrate 12 in the drawing, it is within the scope of the invention to reverse the relative positions of the collector layer 14 and emitter layer 18. Further illustrated are electrically conductive metal collector contacts 20, base contacts 22 and an emitter contact 24.

The HBT 10 may be fabricated using conventional technology, preferably solid-source molecular-beam-epitaxy (MBE). The fabrication process per se is not the particular subject matter of the invention.

The collector layer 14 has a thickness between approximately 250-500 nm, with the preferred value being 300 nm. The collector layer 14 is doped with Si to a free carrier concentration of approximately $1-5 \times 10^{16}$ electrons/$cm^3$, with the preferred value being $1 \times 10^{16}$.

The emitter layer 18 has a thickness between approximately 150-250 nm, with the preferred value being 150 nm. The emitter layer 18 is doped with Si to a free carrier concentration of approximately $4-8 \times 10^{17}$ electrons/$cm^3$, with the preferred value being $8 \times 10^{17}$.

The base layer 16 has a thickness between approximately 50-100 nm. In a preferred embodiment of the invention, the base layer 16 includes a 50 nm thick main layer 16a doped with Be to a free carrier concentration of approximately $3-6 \times 10^{19}$ holes/$cm^3$, with the preferred value being $5 \times 10^{19}$, and a spacer layer 16b disposed between the main layer 16a and the collector layer 14. The spacer layer 16b is preferably 15 nm thick, and doped with Be to a free carrier concentration of $2 \times 10^{18}$ holes/$cm^3$.

In conventional InP/InGaAs and AlInAs/InGaAs HBTs, the base layer is formed of InGaAs. However, in accordance with the present invention, the base layer 16 is formed of ternary GaAsSb doped P-type with Be. Be-doped GaAsSb in the base layer 16 provides improved performance over conventional HBTs by increasing the hole mobilities and valence band offsets to confine the holes to the base region.

Figure 2A:
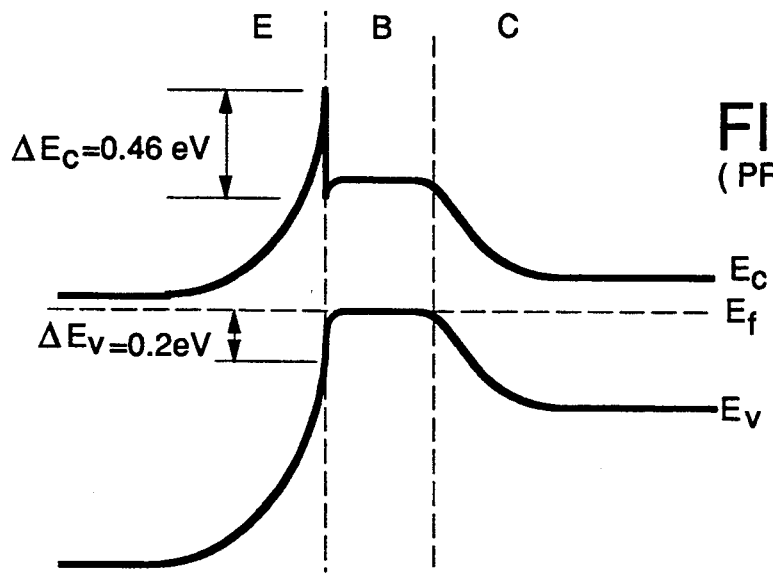
FIG. 2a is an energy band diagram illustrating a prior art HBT including an AlInAs emitter layer and an InGaAs base layer.
Figure 2B:
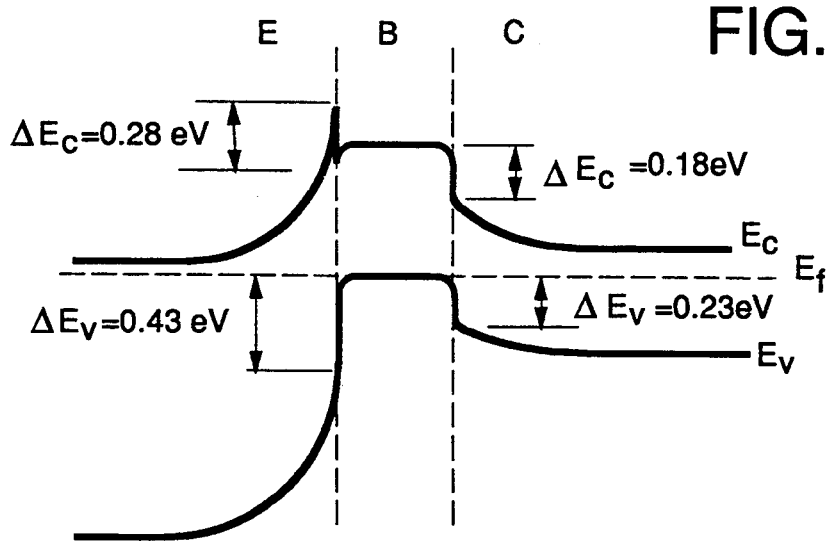
FIG. 2b is similar to FIG. 2a, illustrating an HBT according to the present invention including an AlInAs emitter layer and an GaAsSb base layer.
Figure 3A:
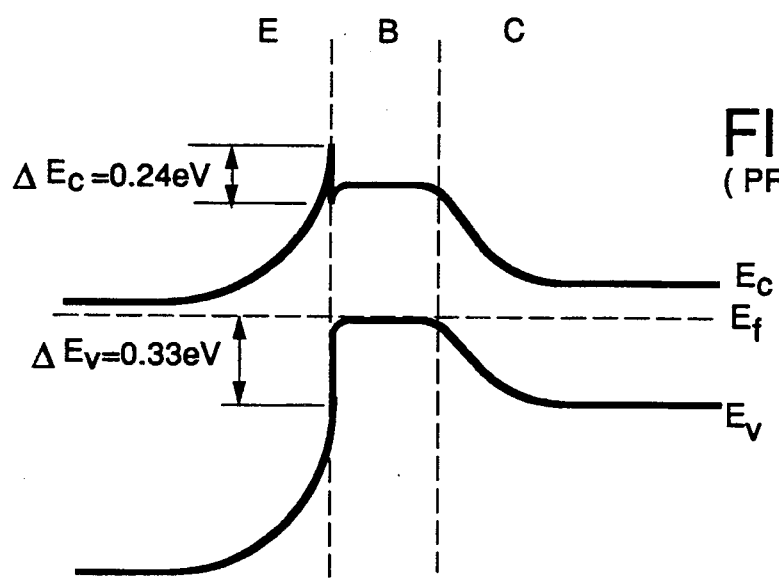
FIG. 3a an energy band diagram illustrating a prior art HBT including an InP emitter layer and an InGaAs base layer.
Figure 3B:
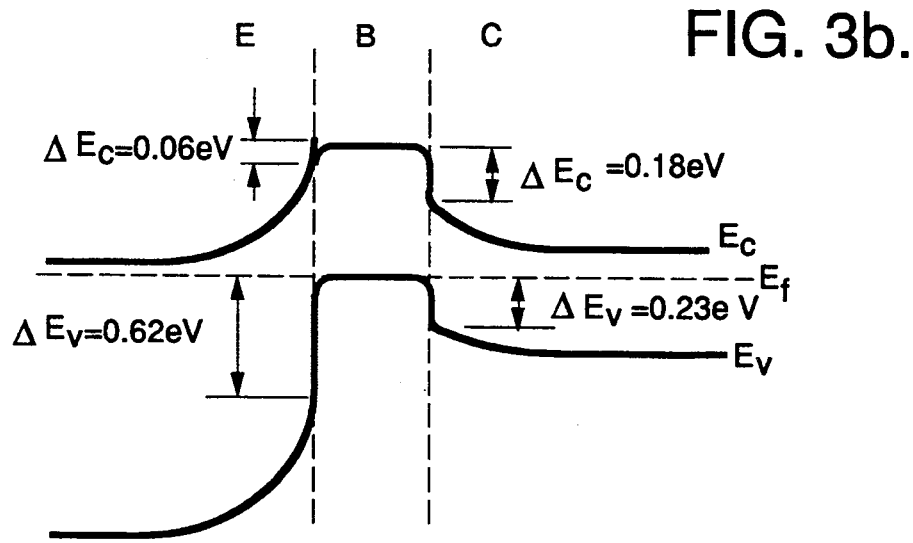
FIG. 3b similar to FIG. 3a, illustrating an HBT according to the present invention including an InP emitter layer and an GaAsSb base layer.

FIG. 2a is an energy band diagram illustrating a prior art HBT including an AlInAs emitter layer and an InGaAs base layer, whereas FIG. 2b illustrates an HBT according to the present invention including an AlInAs emitter layer and a GaAsSb base layer. FIG. 3a is an energy band diagram illustrating a prior art HBT including an InP emitter layer and an InGaAs base layer, whereas FIG. 3b illustrates an HBT according to the present invention including an InP emitter layer and a GaAsSb base layer. The emitter, base and collector layers are designated as E, B and C respectively in the drawings.

As described in an article entitled "Band-edge alignment in heterostructures" by F. Schuermeyer et al, in Applied Physics Letters, Vol. 55, No. 18, Oct. 30, 1989, pp. 1877-1878, the valence band offset $\Delta E_V$ for a GaAsSb/AlInAs heterostructure is 0.43 eV, as compared to 0.2 eV for an InGaAs/AlInAs heterostructure. The increase in $\Delta E_V$ is clearly evident from a comparison of FIGS. 2a and 2b, and provides a substantial improvement in emitter injection efficiency over the prior art by increasing the confinement of holes to the base layer 16.

As illustrated in FIGS. 3a and 3b, the increase in is even greater for the case of an InP emitter. The present GaAsSb base provides $\Delta E_V$ of 0.62 eV as compared to 0.33 for the conventional InGaAs base. The lattice matched emitter/base structure of InP/GaAsSb with $\Delta E_V = 0.62$ eV provides especially efficient emitter injection efficiency.

The present invention also reduces the conduction band offset $\Delta E_C$ as compared to the prior art. This enables a reduction in base-emitter turn-on voltage $V_{BE}$, and a corresponding reduction in power dissipation. For the AlInAs emitter configuration illustrated in FIGS. 2a and 2b, the value of $\Delta E_C$ is reduced from the conventional value of 0.46 eV to 0.28 eV. For the InP emitter configuration illustrated in FIGS. 3a and 3b, the value of $\Delta E_C$ is reduced from the conventional value of 0.24 eV to 0.06 eV.

The present GaAsSb base 16 as lattice matched to the InP substrate 12 provides approximately twice the hole mobility than the conventional InGaAs base, resulting in reduced base resistance and higher $f_{max}$. More specifically, the hole mobility in GaSb is approximately 1,400 $cm^2$/V-sec, as compared to 430 $cm^2$/V-sec in InGaAs.

As further illustrated in FIGS. 2b and 3b, the present GaAsSb base configuration provides valence and conduction band offsets at the base-collector junction which are not present in the conventional InGaAs base HBTs. The valence band offset $\Delta E_V$ at the base-collector junction is 0.23 eV, whereas the corresponding conduction band offset $\Delta E_C$ is 0.18 eV. These offsets produce a potential barrier which enhances hole confinement in the base layer 16, reduces charge storage and increases $f_{max}$.

Figure 4:
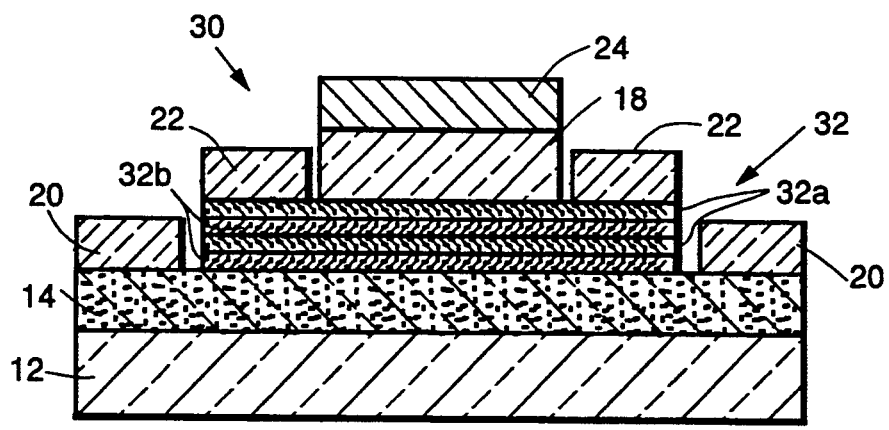
FIG. 4 is a simplified fragmentary sectional view illustrating a second embodiment of an HBT embodying the present invention.

FIG. 4 illustrates another HBT 30 embodying the present invention, in which like reference numerals are used to designate elements which are common to the HBT illustrated in FIG. 1. The HBT 30 differs from the HBT 10 in that the ternary GaAsSb base layer 16 is replaced by a base layer 32 in the form of a strained-layer-superlattice (SLS) structure including alternating superlattice layers 32a of gallium-antimonide (GaSb) doped with Si, and undoped GaAs superlattice layers 32b.

Although the SLS base layer 32 is illustrated in simplified form as including 2.5 periods (number of pairs of superlattice layers 32a and 32b), an actual HBT 30 fabricated in accordance with the invention will include an SLS base layer 32 having approximately 21-27 periods with a corresponding thickness range of approximately 50-100 nm. The preferred thickness value is 65 nm, corresponding to approximately 23 periods. The SLS base layer 32 is preferably fabricated such that the resulting free carrier concentration is approximately $2 \times 10^{18}$ holes/$cm^3$.

It will be understood that although Si is an N-type dopant in InGaAs, InP, AlInAs and GaAsSb, it is a P-type dopant in GaSb as described in an article entitled "p-type doping of gallium antimonide grown by molecular beam epitaxy using silicon" by T. Rossi et al, in Applied Physics Letters, Vol. 57, no. 21, Nov. 19, 1990, pp. 2256-2258. Si is much less diffusive than Be, enabling the HBT 30 to be fabricated with negligible displacement of the P-N junction from the emitter-base junction into the emitter layer 18. This also enables the fabrication process to be simplified since only one dopant material is required.

Although Be is a less preferred P-type dopant for the GaSb superlattice layers 32a, it may be used instead of Si within the scope of the invention.

The GaSb superlattice layers 32a have a compressive strain of approximately 3.5%, whereas the GaAs superlattice layers 32b have a tensile strain of approximately the same magnitude. Since the tensile and compressive strains complement each other, the SLS base layer 32 can be fabricated with an arbitrarily large number of periods if the mole fractions of Sb and As are made equal.

Increasing the mole fraction of Sb in the SLS will improve the performance of the HBT 30 by increasing the hole mobility, reducing the conduction band offset $\Delta E_C$ and increasing the valence band offset $\Delta E_V$. However, the practical upper limit for increasing the Sb mole fraction is believed to be approximately 67%, above which value the SLS will become overstressed and will relax resulting in the formation of misfit dislocations. The valence band offset $\Delta E_V$ with this configuration is approximately 0.89 eV.

EXAMPLE

An HBT was fabricated as described with reference to FIG. 4, with equal mole fractions of Sb and As, and P-type doping of approximately $2 \times 10^{18}$ holes/cm$^3$ in the SLS base layer 32. The average hole mobility at room temperature was approximately 800 cm$^2$/V-sec, four times that of a conventional HBT with an In$_{0.53}$Ga$_{0.47}$As base doped with Be.

While several illustrative embodiments of the invention have been shown and described, numerous variations and alternate embodiments will occur to those skilled in the art, without departing from the spirit and scope of the invention. Accordingly, it is intended that the present invention not be limited solely to the specifically described illustrative embodiments. Various modifications are contemplated and can be made without departing from the spirit and scope of the invention as defined by the appended claims.

We claim:

1. An NPN type heterojunction bipolar transistor (HBT) including a substrate; and emitter, base and collector layers formed over the substrate such that the base layer is disposed between the emitter and collector layers, characterized by:

the emitter layer comprises a material selected from the group consisting of aluminum-indium-arsenide (AlInAs) and indium phosphide (InP) and is doped N-type;

the base layer comprises gallium-arsenide-antimonide (GaAs$_y$Sb$_{1-y}$) and is doped P-type at a doping concentration of about $3-6 \times 10^{19}$/cm$^3$, with the value of y and thickness of the base layer selected so that the base layer is lattice matched with the substrate; and the collector layer comprises a material selected from the group consisting of indium-gallium-arsenide (InGaAs), InP and AlInAs and is doped N-type.

2. An HBT as in claim 1, in which the substrate is semi-insulating.

3. An HBT as in claim 1, in which the collector layer is disposed between the substrate and the base layer.

4. An HBT as in claim 1, in which the base layer is doped with beryllium.

5. An HBT as in claim 1, in which the substrate is InP, the value of y is approximately 0.5 and the base layer is about 50–100 nm thick.

6. An NPN type heterojunction bipolar transistor (HBT) including a substrate; and emitter, base and collector layers formed over the substrate such that the base layer is disposed between the emitter and collector layers, characterized by:

the emitter layer comprises a material selected from the group consisting of aluminum-indium-arsenide (AlInAs) and indium phosphide (InP) and is doped N-type;

the base layer comprises a strained-layer-superlattice (SLS) structure including alternating superlattice layers of gallium-arsenide (GaAs) and P-doped gallium-antimonide (GaSb); and the collector layer comprises a material selected from the group consisting of indium-gallium-arsenide (InGaAs), InP and AlInAs and is doped N-type.

7. An HBT as in claim 6, in which said GaSb superlattice layers are doped with silicon (Si).

8. An HBT as in claim 6, in which said GaAs superlattice layers are undoped.

9. An HBT as in claim 6, in which said superlattice structure has 21–27 periods.

10. An NPN type heterojunction bipolar transistor (HBT) comprising:

an emitter layer including a material selected from the group consisting of aluminum-indium-arsenide (AlInAs) and indium phosphide (InP);

a collector layer; and a base layer including gallium-arsenide-antimonide (GaAs$_y$Sb$_{1-y}$), said base layer being about 50–100 nm thick and disposed between the emitter layer and the collector layer.

11. An HBT as in claim 10, in which the base layer is doped with beryllium at a doping concentration of about $3-6 \times 10^{19}$/cm$^3$.

12. An HBT as in claim 10, in which the value of y is approximately 0.5.

13. An NPN type heterojunction bipolar transistor (HBT) comprising:

an emitter layer including a material selected from the group consisting of aluminum-indium-arsenide (AlInAs) and indium phosphide (InP);

a collector layer; and a base layer disposed between the emitter layer and the collector layer, said base layer comprising a strained-layer-superlattice (SLS) structure including alternating superlattice layers of gallium-arsenide (GaAs) and P-doped gallium-antimonide (GaSb).

14. An HBT as in claim 13, in which said GaSb superlattice layers are doped with silicon (Si).

15. An HBT as in claim 13, in which said GaAs superlattice layers are undoped.

16. An HBT as in claim 13, in which said superlattice structure has 21–27 periods.

17. An NPN type heterojunction bipolar transistor (HBT) comprising:

an emitter layer including a material selected from the group consisting of aluminum-indium-arsenide (AlInAs) and indium phosphide (InP);

a collector layer; and a base layer disposed between the emitter layer and the collector layer, said base layer comprising a strained-layer-superlattice (SLS) structure including alternating superlattice layers of p-doped gallium-arsenide (GaAs) and gallium-antimonide (GaSb).

18. An HBT as in claim 17, in which said GaAs superlattice layers are doped with beryllium (Be).

19. An HBT as in claim 17, in which said GaSb superlattice layers are undoped.

20. An HBT as in claim 17, in which said superlattice structure has 21–27 periods.

* * * * *